United States Patent
Gilford et al.

(10) Patent No.: US 6,675,359 B2
(45) Date of Patent: *Jan. 6, 2004

(54) RECOGNITION OF A STATE MACHINE IN HIGH-LEVEL INTEGRATED CIRCUIT DESCRIPTION LANGUAGE CODE

(76) Inventors: Michael E.J. Gilford, "Lesmarie" Bessels Way, Blewbury, Oxon. OX11 9NN (GB); Gordon N. Walker, 31 East Soley Farm Cottages, Chilton Foliat, Hungerford, Berkshire, RG17 OTX (GB); Jacob L. Tredinnick, 43 Dunn Crescent, Kintbury, Berkshire, RG17 9UH (GB); Mark W.P. Dane, Hawkstone Barn, Taston, Oxfordshire, OX7 3JL (GB); Michael J. Reynolds, 2 Kiln Close, Hermitage, Newbury, Berkshire, RG18 9TQ (GB)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/140,633

(22) Filed: Aug. 26, 1998

(65) Prior Publication Data

US 2002/0016947 A1 Feb. 7, 2002

(51) Int. Cl.$^7$ ............................................. G06F 17/50
(52) U.S. Cl. ............................................. 716/1; 716/18
(58) Field of Search ..................... 716/1, 5, 18, 4, 716/19

(56) References Cited

U.S. PATENT DOCUMENTS 5,537,580 A * 7/1996 Giomi et al. ................ 716/19
5,774,370 A * 6/1998 Giomi ............................ 716/4
6,182,268 B1 * 1/2001 McElvain ....................... 716/1

OTHER PUBLICATIONS

Hoskote et al "Automated Verification of Temporal Properties Specified as State Machine in VHDL," IEEE, 1995, pp. 100–105.*
Kam et al "Comparing Layouts with HDL Models: A Formal Verification Technique," IEEE, Apr. 4, 1995.*
Cheng et al "Compiling Verilog Into Timed Finite State Machines," IEEE, 1995, pp. 32–39.*
Wu et al "A Synthesis Method for Mixed Synchronous/Asynchronous Behavior," IEEE, 1994, pp. 277–281.*
"IEEE Standard VHDL Language Reference Manual," ANSI Std. 1076–1993, Published Jun. 6, 1994.
"IEEE Standard Hardware Description Language Based on the Verilog Hardware Description Language," IEEE Standard 1364–1995, Published Oct. 14, 1996.

* cited by examiner

*Primary Examiner*—Vuthe Siek
(74) *Attorney, Agent, or Firm*—Klarquist Sparkman LLP

(57) ABSTRACT

A method and apparatus for recognizing a state machine in circuit design in a high-level IC description language. The present invention analyzes high-level IC description language code, such as VHDL and Verilog®, of an IC design and extracts description information corresponding to a state machine. The description information can be, for example, the high-level IC description language code corresponding to the state machine, a state diagram of the state machine, a state table for the state machine, or other representation of the state machine. In one embodiment, the present invention identifies a set of one or more processes as defined by VHDL "process" statements. By identifying one or more clocked processes, one or more transition processes, and one or more output processes, the present invention provides a state machine summary to describe the state machine identified in the high-level IC description language code.

22 Claims, 25 Drawing Sheets

-- 
-- VHDL Entity UART.xmit_rcv_control.interface
-- 
LIBRARY ieee;
USE ieee.std_logic_1164.all;
USE ieee.numeric_std.all;

ENTITY xmit_rcv_control IS
  PORT(
        clk : IN      std_logic;
        rst : IN      std_logic;
        sample : IN     std_logic;
        sin : IN      std_logic;
        smart_xmit : IN   std_logic;
        xmitdt : IN unsigned(7 DOWNTO 0);
        done_rcving : OUT    std_logic;
        done_xmitting : OUT  std_logic;
        enable_rcv_clk : OUT  std_logic;
        enable_xmit_clk : OUT std_logic;
        rcv_bit_cnt : OUT     unsigned(2 DOWNTO 0);
        rcving : OUT   std_logic;
        read_bit : OUT  std_logic;
        sout : OUT std_logic;
        xmitting : OUT    std_logic
  );

END xmit_rcv_control;

FIG. 3a

```
--VHDL Architecture UART.xmit_rcv_control.fsm
--
LIBRARY ieee;
USE ieee.std_logic_1164.all;
USE ieee.numeric_std.all;

ARCHITECTURE fsm OF xmit_rcv_control IS

-- Architecture Declarations
    SIGNAL rcv_bit_cnt_int : unsigned(2 downto 0) :="000";
    SIGNAL xmit_bit_cnt : unsigned(2 downto 0) :="000";
    SIGNAL a_used_signal : unsigned(2 downto 0) :="000";

TYPE machine0_state_type IS (
        waiting_to_xmit,
        send_start,
        finish_xmit,
        send_data,
        send_stop_bit,
        done_xmit,
        incr_count
    );
    TYPE machine1_state_type IS (
        waiting,
        read_stop_bit,
        incr_count2,
        read_data,
        done_read,
        check_lock,
        rcv_locked,
        finish_rcv
    );
```

FIG. 3b

```
-- Declare current and next state signals
    SIGNAL machine0_current_state,machine0_next_state:
machine0_state_type;
    -- pragma translate_off
    SIGNAL
machine0_rn_next,machine0_rn_current,machine0_rn_clock:
INTEGER;
    -- pragma translate_on
    SIGNAL machine1_current_state, machine1_next_state:
machine1_state_type;

BEGIN

------------------------------------------------------------
machine0_clocked : PROCESS (
    clk,
    rst
)
------------------------------------------------------------
BEGIN
    IF (rst= '0') THEN
        machine0_current_state <= waiting_to_xmit;
        -- Reset Actions
        xmit_bit_cnt<="000";
        -- pragma translate_off
        machine0_rn_current<=0;
        -- pragma translate_on
    ELSIF (clk'EVENT AND clk = '1') THEN
        machine0_current_state <= machine0_next_state;
        -- pragma translate_off
        machine0_rn_current <= machine0_rn_next;
        machine0_rn_clock <= -1;
        machine0_rn_clock <= 0;
        -- pragma translate_on
```

FIG. 3c

```
-- State Actions for internal signals only
CASE machine0_current_state IS
WHEN waiting_to_xmit =>
      xmit_bit_cnt <= "000";
WHEN OTHERS =>
      NULL;
END CASE;

-- Transition Actions for internal signals only
CASE machine0_current_state IS
WHEN send_data =>
      IF (sample='0') THEN
            xmit_bit_cnt<=xmit_bit_cnt+"1";
      END IF;
WHEN OTHERS =>
      NULL;
END CASE;

END IF;

END PROCESS machine0_clocked;
```

---

```
machine0_nextstate : PROCESS (
      machine0_current_state,
      machine1_current_state,
      rcv_bit_cnt_int,
      xmit_bit_cnt,
      sample,
      start_xmit,
      xmitdt,
      sin
)
```

```
BEGIN
    CASE machine0_current_state IS
    WHEN waiting_to_xmit =>
            IF (start_xmit='1') THEN
                    machine0_next_state <= send_start;
                    -- pragma translate_off
                    machine0_rn_next <= 1;
                    -- pragma translate_on
            ELSE
                    machine0_next_state <= waitning_to_xmit;
                    -- pragma translate_off
                    machine0_rn_next <= 0;
                    -- pragma translate_on
            END IF;
    WHEN send_start =>
            IF (sample='1') THEN
                    machine0_next_state <= send_data;
                    -- pragma translate_off
                    machine0_rn_next <= 2;
                    -- pragma translate_on
            ELSE
                    machine0_next_state <= send_start;
                    -- pragma translate_off
                    machine0_rn_next <= 0;
                    -- pragma translate_on
            END IF;
    WHEN finish_xmit =>
            machine0_next_state <= waiting_to_xmit;
            -- pragma translate_off
            machine0_rn_next <= 3;
            -- pragma translate_on
```

*FIG. 3e*

```
WHEN send_data =>
        IF (sample='0') THEN
                machine0_next_state <= incr_count;
                -- pragma translate_off
                machine0_rn_next <= 4;
                -- pragma translate_on
        ELSE
                machine0_next_state <= send_data;
                -- pragma translate_off
                machine0_rn_next <= 0;
                -- pragma translate_on
        END IF;
WHEN send_stop_bit =>
        machine0_next_state <= finish_xmit;
        -- pragma translate_off
        machine0_rn_next <= 5;
        -- pragma translate_on
WHEN done_xmit =>
        IF (sample='0') THEN
                machine0_next_state <= send_stop_bit;
                -- pragma translate_off
                machine0_rn_next <= 6;
                -- pragma translate_on
        ELSE
                machine0_next_state <= done_xmit;
                -- pragma translate_off
                machine0_rn_next <= 0;
                -- pragma translate_on
        END IF;
```

*FIG. 3f*

```
            WHEN incr_count =>
                IF (sample='1' AND xmit_bit_cnt/="000") THEN
                    machine0_next_state <= send_data;
                    -- pragma translate_off
                    machine0_rn_next <= 7;
                    -- pragma translate_on
                ELSIF (sample='1' AND xmit_bit_cnt="000") THEN
                    machine0_next_state <= done_xmit;
                    -- pragma translate_off
                    machine0_rn_next <= 8;
                    -- pragma translate_on
                ELSE
                    machine0_next_state <= incr_count;
                    -- pragma translate_off
                    machine0_rn_next <= 0;
                    -- pragma translate_on
                END IF;
            WHEN OTHERS =>
                NULL;
        END CASE;

END PROCESS machine0_nextstate;

----------------------------------------------------------------
machine0_output : PROCESS (
        machine0_current_state,
        machine1_current_state,
        rcv_bit_cnt_int,
        xmit_bit_cnt,
        sample,
        start_xmit,
        xmitdt,
        sin
)
----------------------------------------------------------------
```

FIG. 3g

```
BEGIN
      -- Global Actions
      done_xmitting<='0';
      sout<='1';
      xmitting<='0';
      enable_xmit_clk<='0';
      -- State Actions
      CASE machine0_current_state IS
      WHEN waiting_to_xmit =>
            done_xmitting<='0';
            sout<='1';
            xmitting<='0';
            enable_xmit_clk<='0';
      WHEN send_start =>
            sout<='0';
            enable_xmit_clk<='1';
            xmitting<='1';
      WHEN send_data =>
            sout <= xmitdt(TO_INTEGER('0'&a_used_signal));
            enable_xmit_clk<='1';
            xmitting<='1';
      WHEN send_stop_bit =>
            done_xmitting<='1';
      WHEN done_xmit =>
            enable_xmit_clk<='1';
            xmitting<='1';
      WHEN incr_count =>
            sout <= xmitdt(TO_INTEGER('0'&xmit_bit_cnt));
            enable_xmit_clk<='1';
            xmitting<='1';
      WHEN OTHERS =>
            NULL;
      END CASE;
END PROCESS machine0_output;
```

FIG. 3h

```
machine1_clocked : PROCESS (
    clk,
    rst
)
```

```
BEGIN
    IF (rst = '0') THEN
        machine1_current_state <= waiting;
        -- Reset Actions
        rcv_bit_cnt_int<="000";
    ELSIF (clk'EVENT AND clk = '1') THEN
        machine1_current_state <= machine1_next_state;
        -- State Actions for internal signals only
        CASE machine1_current_state IS
        WHEN waiting =>
            rcv_bit_cnt_int <= "000";
        WHEN OTHERs =>
            NULL;
        END CASE;
        -- Transition Actions for internal signals only
        CASE machine1_current_state IS
        WHEN incr_count2 =>
            IF (sample='1' AND rcv_bit_cnt_int/="111") THEN
                rcv_bit_cnt_int<=rcv_bit_cnt_int + "1";
            END IF;
        WHEN OTHERS =>
            NULL;
        END CASE;
    END IF;
END PROCESS machine1_clocked;
```

*FIG. 3i*

```
machine1_nextstate : PROCESS (
    machine0_current_state,
    machine1_current_state,
    rcv_bit_cnt_int,
    xmit_bit_cnt,
    sample,
    start_xmit,
    xmitdt,
    sin
)
------------------------------------------------------------
BEGIN
    CASE machine1_current_state IS
    WHEN waiting =>
        IF (sin='0') THEN
            machine1_next_state <= check_lock;
        ELSE
            machine1_next_state <= waiting;
        END IF;
    WHEN read_stop_bit =>
        IF (sample='1') THEN
            machine1_next_state <= finish_rcv;
        ELSE
            machine1_next_state <= read_stop_bit;
        END IF;
    WHEN incr_count2 =>
        IF (sample='1' AND rcv_bit_int="111") THEN
            machine1_next_state <= read_data;
        ELSIF (sample='1' AND rcv_bit_cnt_int="111") THEN
            machine1_next_state <= done_read;
        ELSE
            machine1_next_state <= incr_count2;
```

FIG. 3j

```
        END IF;
            WHEN read_data =>
                IF (sample='0') THEN
                    machine1_next_state <= incr_count2;
                ELSE
                    machine1_next_state <= read_data;
                END IF;
            WHEN done_read =>
                IF (sample='0') THEN
                    machine1_next_state <= read_stop_bit;
                ELSE
                    machine1_next_state <= done_read;
                END IF;
            WHEN check_lock =>
                IF (sin='1') THEN
                    machine1_next_state <= waiting;
                ELSIF (sin='0') THEN
                    machine1_next_state <= rcv_locked;
                ELSE
                    machine1_next_state <= check_lock;
                END IF;
            WHEN rcv_locked =>
                IF (sample='1') THEN
                    machine1_next_state <= read_data;
                ELSE
                    machine1_next_state <= rcv_locked;
                END IF;
            WHEN finish_rcv =>
                    machine1_next_state <= waiting;
            WHEN OTHERS =>
                NULL;
        END CASE;

END PROCESS machine1_nextstate;
```

FIG. 3k

```
machine1_output : PROCESS (
      machine0_current_state,
      machine1_current_state,
      rcv_bit_cnt_int,
      xmit_bit_cnt,
      sample,
      start_xmit,
      xmitdt,
      sin
)
------------------------------------------------------------
BEGIN
      -- Global Actions
      rcv_bit_cnt <= rcv_bit_cnt_int;
      enable_rcv_clk<='0';
      done_rcving<='0';
      read_bit<='0';
      rcving<='0';

-- State Actions
      CASE machine1_current_state IS
      WHEN waiting =>
            enable_rcv_clk<='0';
            done_rcving<='0';
            read_bit<='0';
            rcving<='0';
      WHEN read_stop_bit=>
            rcving<='1';
            enable_rcv_clk<='1';
      WHEN incr_count2=>
            rcving<='1';
            enable_rcv_clk<='1';
```

FIG. 31

```
WHEN read_data =>
        rcving<='1';
        enable_rcv_clk<='1';
WHEN done_read =>
        rcving<='1';
        enable_rcv_clk<='1';
WHEN check_lock =>
        enable_rcv_clk<='1';
WHEN rcv_locked =>
        rcving<='1';
        enable_rcv_clk<='1';
WHEN finish_rcv =>
        enable_rcv_clk<='0';
        rcving<='0';
        done_rcving<='1';
WHEN OTHERS =>
        NULL;
END CASE;
```

FIG. 3m

```
            -- Transition Actions
    CASE machine1_current_state IS
    WHEN waiting =>
            IF (sin='0') THEN
                    enable_rcv_clk<='1';
            END IF;
    WHEN incr_count2 =>
            IF (sample='1' AND rcv_bit_cnt_int/="111") THEN
                    read_bit <='1';
            ELSIF (sample='1' AND rcv_bit_cnt_int="111") THEN
                    read_bit <='1';
            END IF;
    WHEN check_lock =>
            IF (sin='1') THEN
                    enable_rcv_clk<='0';
            END IF;
    WHEN OTHERS =>
            NULL;
    END CASE;

END PROCESS machine1_output;

END fsm;
```

FIG. 3n

Architecture xmit_rcv_control() is a state machine with 2 state variables.
    clock name: clk
    clock type: std_logic
    reset name: rst
    reset type: std_logic
    State variable (1):
        curr: machine0_current_state
        next: machine0_next_state
        type: machine0_state_type
        start@: waiting_to_xmit
        states: waiting_to_xmit=000, send_start=001, finish_xmit=010,
        send_data=011, send_stop_bit=100, done_xmit=101, incr_count=110,
        synch.: 0
        trans.: 1
        output: 2
    State variable (2):
        curr: machine1_current_state
        next: machine1_next_state
        type: machine1_state_type
        start@: waiting
        states: waiting=000, read_stop_bit=001, incr_count2=010, read_data=011,
        done_read=100, check_lock=101, rcv_locked=110, finish_rcv=111,
        synch.: 3
        trans.: 4
        output: 5

FIG. 12

RECOGNITION OF A STATE MACHINE IN HIGH-LEVEL INTEGRATED CIRCUIT DESCRIPTION LANGUAGE CODE

FIELD OF THE INVENTION

The present invention relates to use of high-level integrated circuit description languages. More particularly, the present invention relates to analysis of high-level integrated circuit description language to identify code sequences defining integrated circuit implementations of state machines.

BACKGROUND OF THE INVENTION

High-level integrated circuit (IC) description languages such as VHDL and Verilog® (M are commonly used to design circuits. One embodiment of VHDL is described in greater detail in "IEEE Standard VHDL Language Reference Manual," ANSI Std. 1076-1993, published Jun. 6, 1994. One embodiment of Verilog® is described in greater detail in "IEEE Standard Hardware Description Language Based on the Verilog® Hardware Description Language," IEEE Standard 1364-1995, published Oct. 14, 1996. These high-level IC description languages allow a circuit designer to design and simulate circuits by using high-level code to describe the structure and/or behavior of the circuit being designed.

The high-level IC description language code is used to produce a netlist that describes an interconnection of circuit components to provide desired functionality. The netlist can then be used to develop the layout and ultimately fabricate an IC having the functionality of the designed circuit. The netlist can also be used for verification purposes.

Over time, many complex circuits have been designed using high-level IC description languages. The complexity of the code describing the circuits increases with the complexity of the circuit described, which in turn increases the cost of modifications to customize the circuit for new environments especially if the code is poorly documented and/or the original circuit designer is not available.

One component of a circuit design that is often modified to adapt the circuit design to a new environment is the state machine. A state machine is often used for control purposes, which is dependent on the environment in which the circuit design must operate. Therefore, in order to modify the circuit design to operate in a new environment, the state machine is often modified accordingly.

What is needed is a tool for recognizing and extracting state machines from high-level IC description language code.

SUMMARY OF THE INVENTION

A method and apparatus for identifying a integrated circuit (IC) implementation of a state machine in high-level IC description language code is described. One or more transition processes within the high-level IC description language code are identified. A state machine summary is built based at least in part on the one or more transition processes identified.

In one embodiment, one or more clocked processes and one or more output processes are also identified. A state machine summary is built based at least in part on the one or more transition processes, the one or more clocked processes and the one or more output processes. In one embodiment, the state machine summary is a textual description of the state machine. Alternatively, the state machine summary is a graphical representation of the state machine.

BRIEF DESCRIPTION OF THE DRAWINGS

The present invention is illustrated by way of example, and not by way of limitation, in the figures of the accompanying drawings in which like reference numerals refer to similar elements.

FIGS. 3a–3n are one embodiment of VHDL code describing a state machine implementation.

FIG. 12 is one embodiment of an output generated describing the state machine of FIGS. 3a–3n according to the present invention.

DETAILED DESCRIPTION

A method and apparatus for recognizing and extracting a state machine representation from high-level integrated (IC) description language code is described. In the following description, for purposes of explanation, numerous specific details are set forth in order to provide a thorough understanding of the present invention. It will be apparent, however, to one skilled in the art that the present invention can be practiced without these specific details. In other instances, well-known structures and devices are shown in block diagram form in order to avoid obscuring the present invention.

Briefly, the present invention analyzes high-level IC description language code, such as VHDL and Verilog®, of an IC design and extracts description information corresponding to a state machine. The description information can be, for example, the high-level IC description language code corresponding to the state machine, a state diagram of the state machine, a state table for the state machine, or other representation of the state machine. In one embodiment, the present invention identifies a set of one or more processes as defined by VHDL "process" statements. By identifying one or more clocked processes, one or more transition processes, and/or one or more output processes, the present invention provides a state machine summary to describe the state machine identified in the high-level IC description language code.

Figure 1:
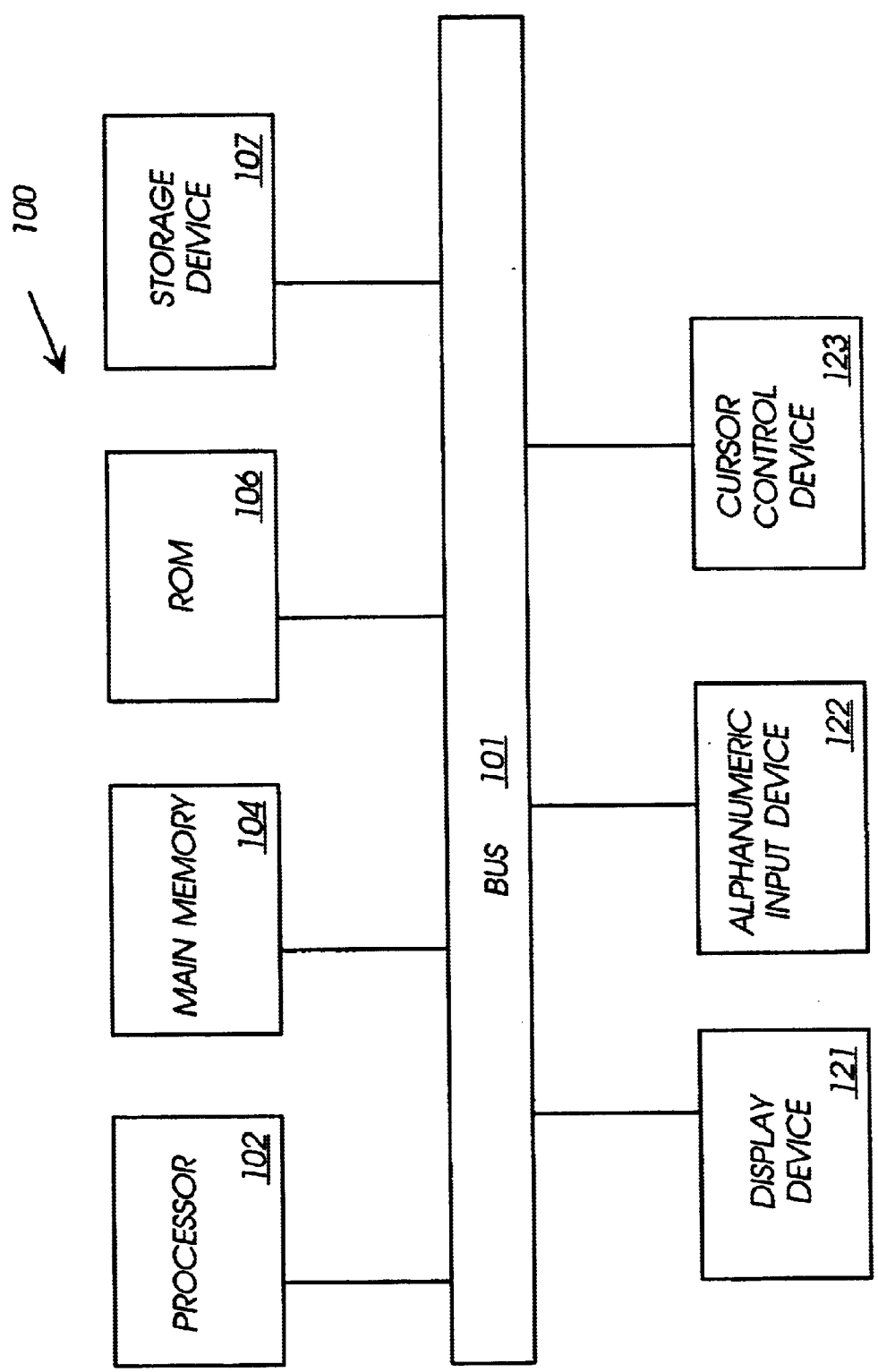
FIG. 1 is one embodiment of a computer system suitable for use to practice the present invention.

FIG. 1 is one embodiment of a computer system suitable for use to practice the present invention. Computer system 100 includes bus 101 or other communication device for communicating information, and processor 102 coupled with bus 101 for processing information. Computer system 100 further includes random access memory (RAM) or other dynamic storage device 104 (referred to as main memory), coupled to bus 101 for storing information and instructions to be executed by processor 102. Main memory 104 also can be used for storing temporary variables or other intermediate information during execution of instructions by processor 102. Computer system 100 also includes read only memory (ROM) and/or other static storage device 106 coupled to bus 101 for storing static information and instructions for processor 102. Data storage device 107 is coupled to bus 101 for storing information and instructions.

Data storage device 107 such as a magnetic disk or optical disc and its corresponding drive can be coupled to computer system 100. Computer system 100 can also be coupled via bus 101 to display device 121, such as a cathode ray tube (CRT) or liquid crystal display (LCD), for displaying information to a computer user. Alphanumeric input device 122, including alphanumeric and other keys, is typically coupled to bus 101 for communicating information and command selections to processor 102. Another type of user input device is cursor control 123, such as a mouse, a trackball, or cursor direction keys for communicating direction information and command selections to processor 102 and for controlling cursor movement on display 121.

The present invention is related to the use of computer system 100 to recognize and extract a state machine from high-level IC description language code. According to one embodiment, recognition and extraction of state machine code from high-level IC description language code is performed by computer system 100 in response to processor 102 executing sequences of instructions contained in memory 104. Execution of the sequences of instructions contained in memory 104 causes processor 102 to recognize and extract state machine code in high-level IC description language code, as will be described hereafter.

Instructions are provided to main memory 104 from a storage device, such as magnetic disk, CD-ROM, DVD, via a remote connection (e.g., over a network), etc. In alternative embodiments, hard-wired circuitry can be used in place of or in combination with software instructions to implement the present invention. Thus, the present invention is not limited to any specific combination of hardware circuitry and software structure.

Figure 2:
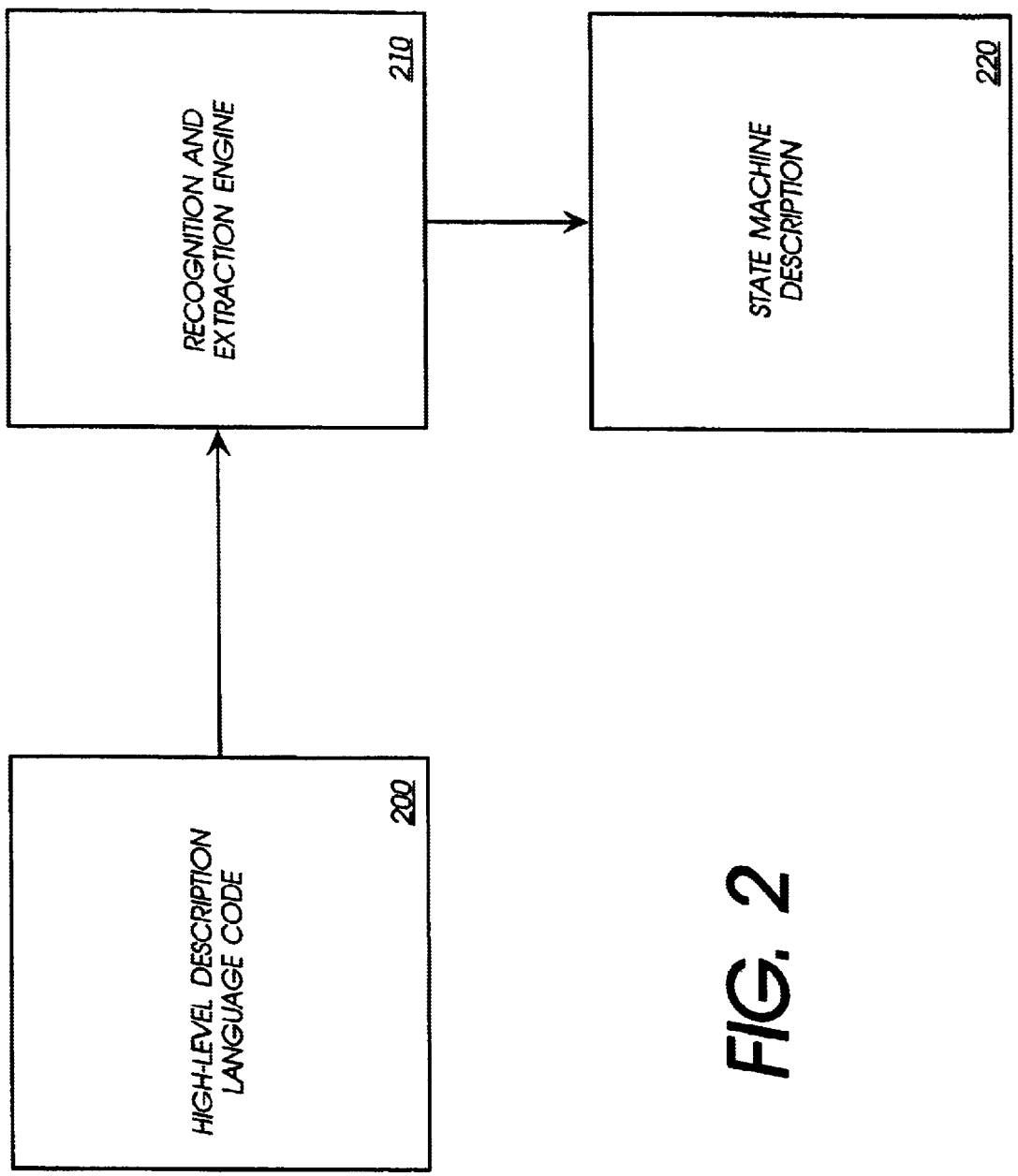
FIG. 2 is one embodiment of a block diagram of a recognition and extraction process for extracting a state machine from high-level IC description language code.

FIG. 2 is one embodiment of a block diagram of a recognition and extraction process for extracting a state machine from high-level IC description language code. The components of FIG. 2 analyze high-level IC description language code for segments or sequences of instructions that define a state machine implementation in the IC circuit design.

The present invention is described below using block diagrams. The blocks of the block diagrams are not intended to specifically denote either hardware or software implementation for components or devices. For example, the recognition and extraction engine can be a software entity that performs the functions described below, or the recognition and extraction engine can be a hardware device designed to perform the functions described below. Alternatively, the recognition and extraction engine can be some combination of hardware and software.

The high-level IC description language code defining the state machine is recognized and information is extracted from the high-level IC description language code and produced as output data. The extracted information describing a state machine can be used, for example, to generate a graphical representation of the state machine as described in U.S. patent application Ser. No. 09/140,632 filed Aug. 26, 1998, entitled "METHOD AND APPARATUS FOR GRAPHICALLY PRESENTING AN INTEGRATED CIRCUIT DESIGN," which is assigned to the corporate assignee of the present invention and hereby incorporated by reference. Alternatively, the output file can include a textual description of the state machine as is described in greater detail below.

High-level IC description language code 200 is any file or set of data including code written according to a high-level IC description language. The present invention is generally described in terms of VHDL code; however, any high-level IC description language, such as Verilog® can be used.

Analog/mixed-signal versions of high-level IC description languages (e.g., HDL-A®, VHDL-AMS, Verilog®-AMS) can also be used for high-level IC description language code 200. One embodiment of VHDL-AMS is described in greater detail in 1076.1 Language Design Committee, several papers under the generic name "White Papers", IEEE 1076.1 Internal work, 1996, and "1076.1 Working Document: Definition of Analog Extensions to IEEE Standard VHDL", IEEE 1076.1 Committee Internal work, July, 1997.

High-level IC description language code 200 provides input to recognition and extraction engine 210. In one embodiment, recognition and extraction engine 210 is a computer system, such as computer system 100 of FIG. 1, executing a sequence of instructions to perform the process of recognition and extraction of state machine code; however, special purpose computer systems or other diagnostic or simulation tools can also be used.

Recognition and extraction engine 210 generates an output that is state machine description 220. In one embodiment, state machine description 220 is a graphical representation of a state diagram corresponding to the extracted state machine. Alternatively, state machine description 220 is a textual or tabular representation of the state machine and corresponding states.

In one embodiment, recognition and extraction engine 210 identifies the following attributes for each state machine recognized: state variables, states for each state variable, one or more transition processes for each state variable, a clock signal for the state machine, a reset signal for the state machine, a clocked process for each state variable, and one or more output processes for each state variable. Other combinations of attributes including some or all of the above attributes can also be used to describe a state machine.

In general, identifying one of the attributes listed above aids in the identification of the remaining attributes. In addition, identification of attributes can cause reevaluation of previously identified attributes. Typically, identification of a clocked process is one of the easier attributes to identify, therefore recognition starts with identification of one or more clocked processes; however, recognition can start with identification of other attributes such as transition processes. Also, identification of a clocked process simplifies identification of clock signal(s), reset signal(s) and state variables.

In one embodiment, state variables are identified before a transition process is identified because a transition process is easier to find after the state variables on which it operates are identified than before. Output processes can then be identified, if necessary.

Identification of attributes is not required to proceed in the manner described; however, doing so can increase run-time performance. Because clocked processes are often the easiest attribute to identify, doing so first simplifies the overall state machine recognition process by reducing the number of processing iterations that are performed to recognize a state machine.

In one embodiment, attributes are recognized in the following order: a clocked process for each state variable, a reset signal, a clock signal, state variables, one or more transition processes for each state variable, one or more output processes for each state variable, and the states for each state variable. The last two attributes are easily interchanged because the two attributes are not interrelated. Alternatively, a transition process and state variables are identified to describe the state machine.

FIGS. 3a–3n are one embodiment of VHDL code describing a state machine implementation. The state machine of FIGS. 3a–3n is a concurrent state machine that can be recognized and extracted with the present invention. The state machine of FIGS. 3a–3n provides one embodiment of a universal asynchronous receiver/transmitter (UART).

Figure 4:
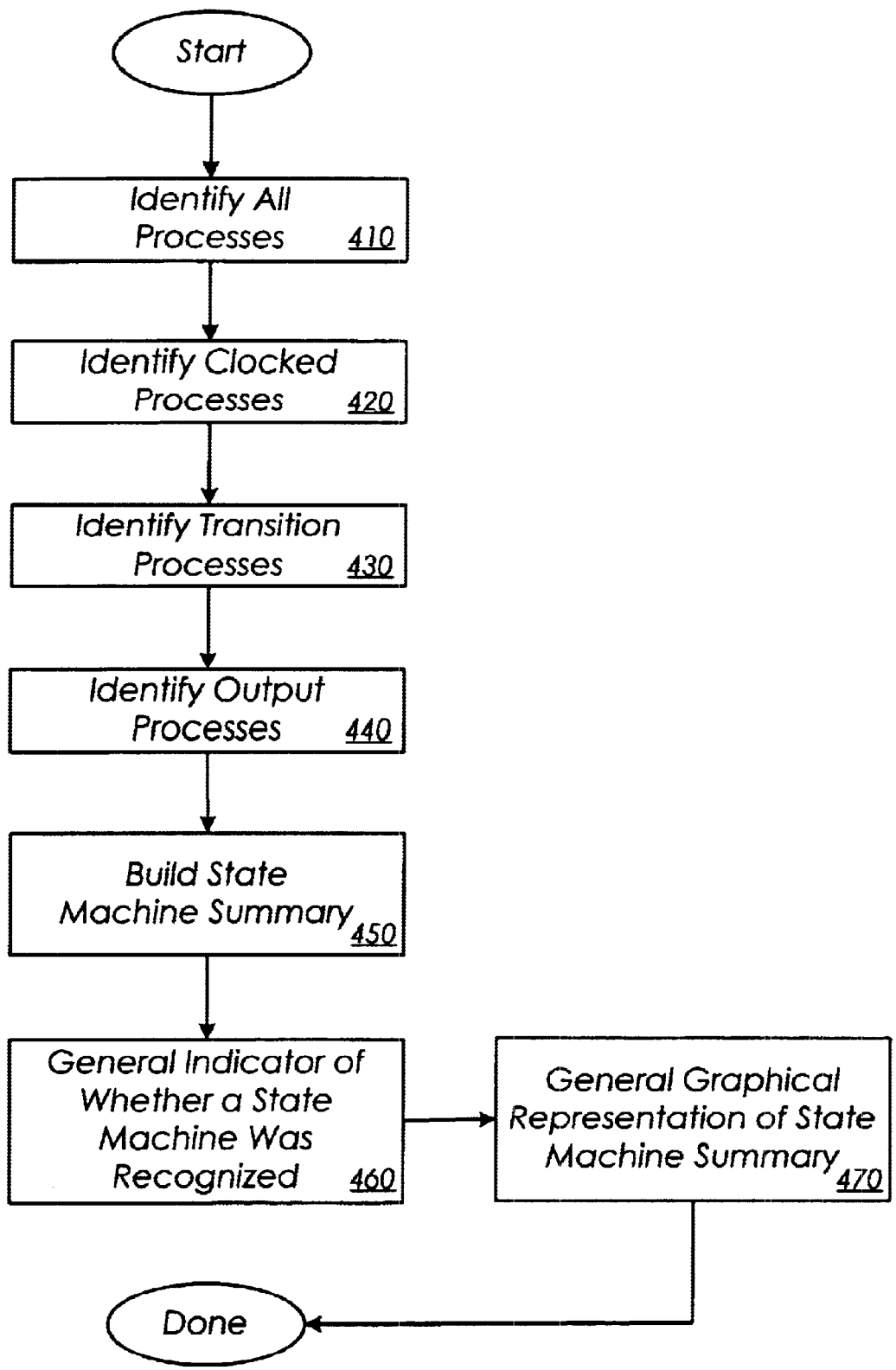
FIG. 4 is one embodiment of a flow diagram for recognizing a state machine according to the present invention.

FIG. 4 is one embodiment of a flow diagram for recognizing a state machine according to the present invention. In one embodiment, the recognition and extraction engine parses the high-level IC description language code to identify all processes, 410. The recognition and extraction engine identifies each "process" statement in VHDL code. In the example of FIGS. 3a–3n the following six processes are identified: machine0_clocked (FIG. 3c); machine0_nextstate (FIG. 3d); machine0_output (FIG. 3g); machine1_clocked (FIG. 3i); machine1_nextstate (FIG. 3j); and machine1_output (FIG. 3l). When parsing Verilog® code, the recognition and extraction engine identifies "always" or "initial" statements.

After the processes are identified, a subset of clocked processes are identified, 420. In one embodiment, to determine whether a process is a clocked process, the recognition and extraction engine parses the process (or always/initial structure in Verilog®) for a condition that changes the state of the process on a clock transition. In the example of FIGS. 3a–3n, the following two clocked processes are identified: machine0_clocked (FIG. 3c); and machine1_clocked (FIG. 3i).

Transition processes are identified, 430. Transition processes are processes in which state assignments are made. For example, in the state machine of FIGS. 3a–3n, the following two transition processes are identified: machine0_nextstate (FIG. 3d); and machine1_13nextstate (FIG. 3j).

Output processes are identified, 440. Output processes are processes that assign a value to a non-state variable output signal. For example, in the state machine of FIGS. 3a–3n, the following two output processes are identified: machine0_output (FIG. 3g); and machine1_output (FIG. 3l).

A state machine summary is built, 450. One embodiment of a state machine summary is described in greater detail below with respect to FIG. 12. The state machine summary can be used, for example, to generate a graphical representation of the state machine including a state diagram or a state table.

In one embodiment, an indicator of whether a state machine was recognized is generated, 460. The indicator can be used, for example, to determine whether the recognition and extraction process should continue.

Figure 5:
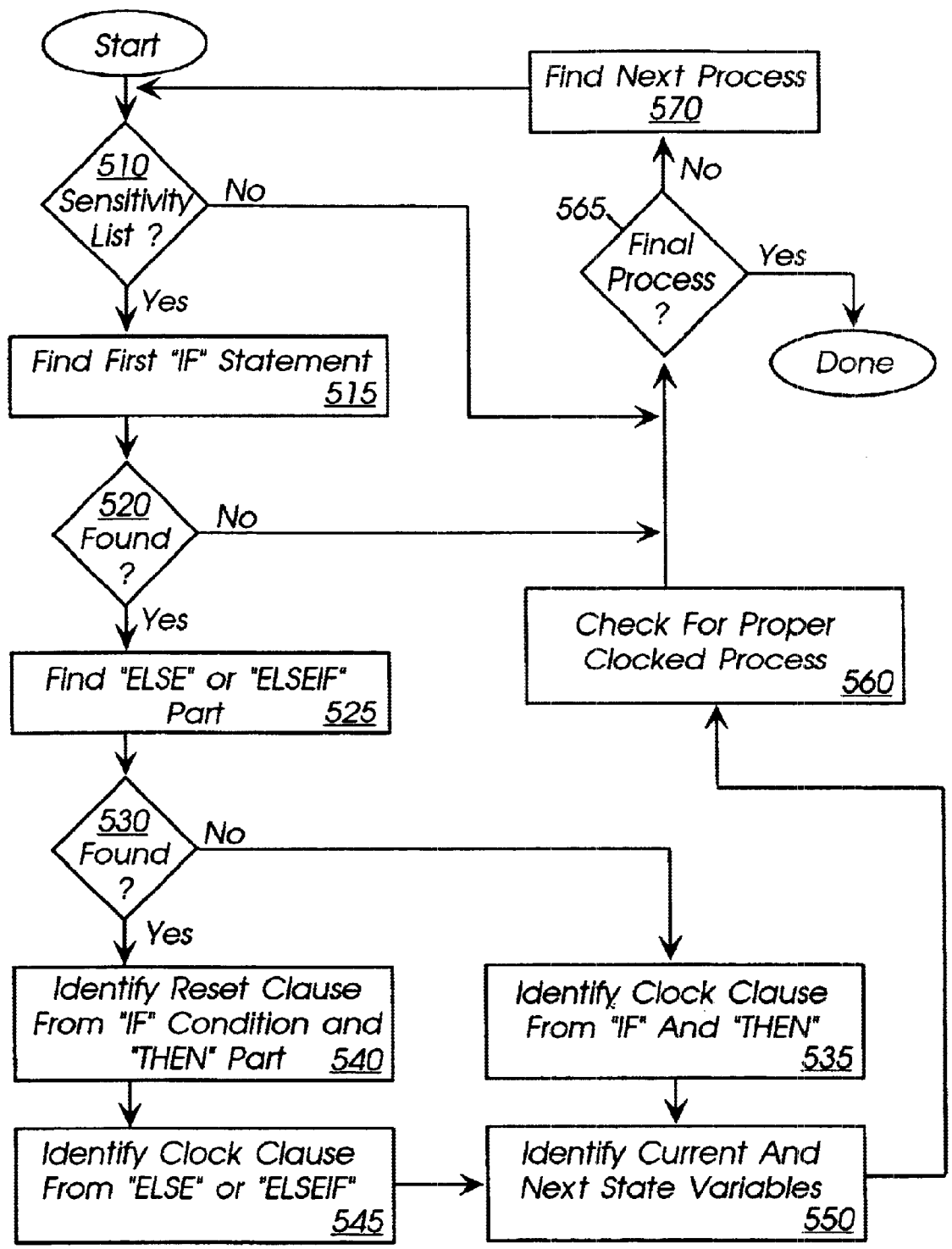
FIG. 5 is one embodiment of a flow diagram for identifying a clocked process according to the present invention.

FIG. 5 is one embodiment of a flow diagram for identifying a clocked process according to the present invention. Both VHDL and Verilog® embodiments find IF statements to identify a state machine implementation. An IF-THEN-ELSE statement in VHDL consists of:

IF <condition> THEN <then-part> [optional ELSIF part] [optional ELSE part] ENDIF;

where [optional ELSIF part] is zero or more:

ELSIF <condition>THEN <else-if-then part>;

and [optional ELSE part] is zero or one:

ELSE <else part>.

Verilog® syntax is slightly different. In Verilog® an IF-THEN-ELSE statement consists of:

if <condition> [optional else part];

where [optional else part] is:

else <else-statement>.

In Verilog® an <else-statement> may itself be an if statement, which results in:

else if <condition><then-statement> else <else-statement>.

Each process is checked for a sensitivity list, 510. If the process does not have a sensitivity list and the process is not the final process at 565, the next process is evaluated, 570. If the process is the final process at 565, evaluation is complete.

If the process has a sensitivity list, the first IF statement in the process body is identified, 515. In one embodiment, the present invention assumes that the first IF statement includes "reset" and/or "clock" conditions. Alternatively, the first IF statement is not required to include the reset and/or clock conditions.

If an IF statement is not found at 520 and the process is not the final process at 565, the next process is evaluated, 570. If an IF statement is found at 520, an associated ELSE or ELSIF part is sought, 525. If an ELSE or ELSIF part ("else if" in Verilog®) is found at 530, the RESET clause is identified from the IF condition and corresponding THEN part, 540. Identification of the reset clause is discussed in greater detail below.

If a reset clause is identified from the IF and THEN parts, the clock clause is identified from the ELSE or ELSIF parts, 545. If the IF statement does not include ELSE or ELSIF parts, the clock clause is identified from the IF and THEN parts, 535.

If the clock clause is identified the current and next state variables are identified, 550. In one embodiment, the current process can be marked as a transition process (not shown in FIG. 5). For example, if the current process is a clocked process and a transition process that assigns state variables, the process is marked as a transition process at 550. Determining whether a process is a transition process is described in greater detail below. The clocked process is checked for proper form at 560, which is described in greater detail below. If the current process is not the last process at 565, the next process is evaluated, 570. If the current process is the final process, evaluation is complete.

Figure 6:
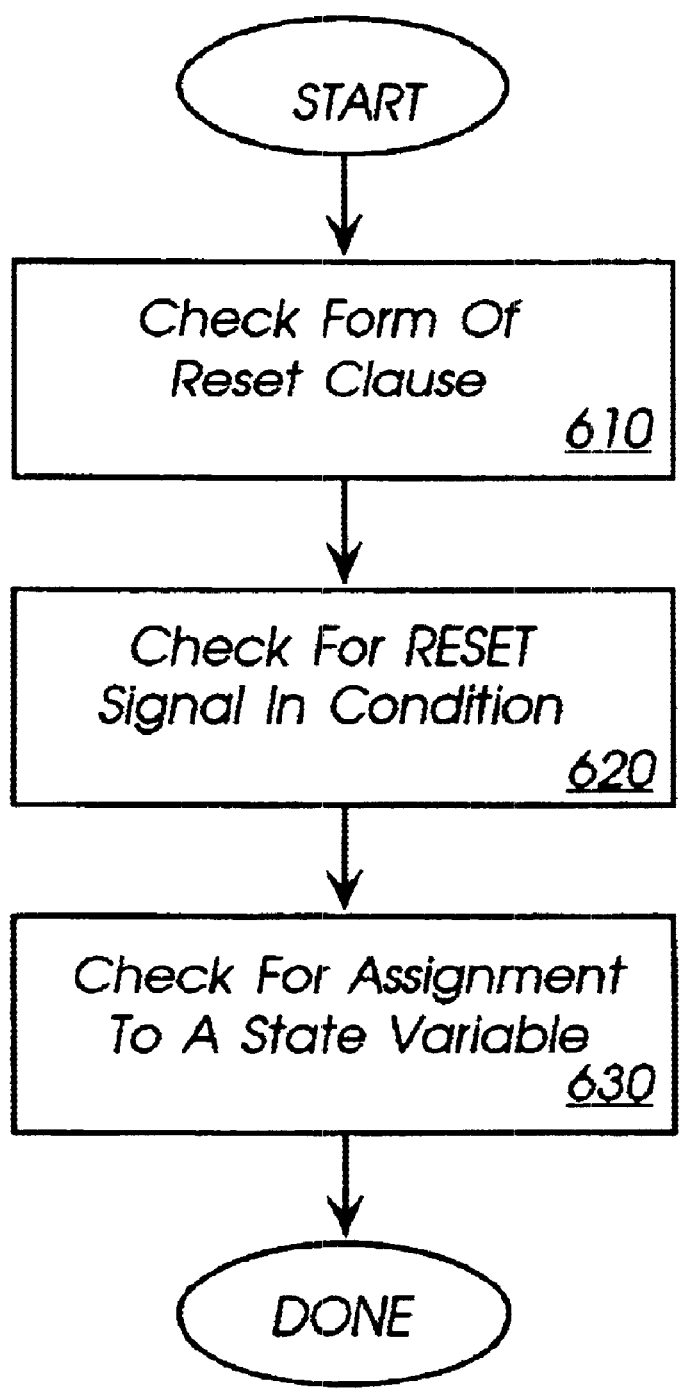
FIG. 6 is one embodiment of a flow diagram for identifying a reset clause according to the present invention.

FIG. 6 is one embodiment of a flow diagram for recognizing a reset clause of a state machine from corresponding high-level IC description language code. In one embodiment, the reset clause must be of the form "IF <reset_condition> THEN <action>". In one embodiment, a condition is considered a reset condition when the condition tests for equality or inequality and a signal is checked against a constant or enumeration literal.

The recognition and extraction engine 610 checks the form of the reset condition, 610. The reset condition can include both constants and enumeration literal types. In one embodiment, the reset condition can be enclosed in parentheses and can include calls to the negation operator or negation function.

If the reset clause is in the proper form, the recognition and extraction engine checks for the reset signal in the condition, 620. For example, "rst='0'" or "rst/='0'" can be used to describe the reset condition. Other uses of the reset signal in the condition can also be supported.

If 610 and 620 are satisfied, the recognition and extraction engine checks for an assignment to a state variable in the THEN part of the reset clause, 630. If 610, 620 and 630 are satisfied, the reset clause is recognized. Otherwise, recognition ceases when a condition is not satisfied.

Figure 7:
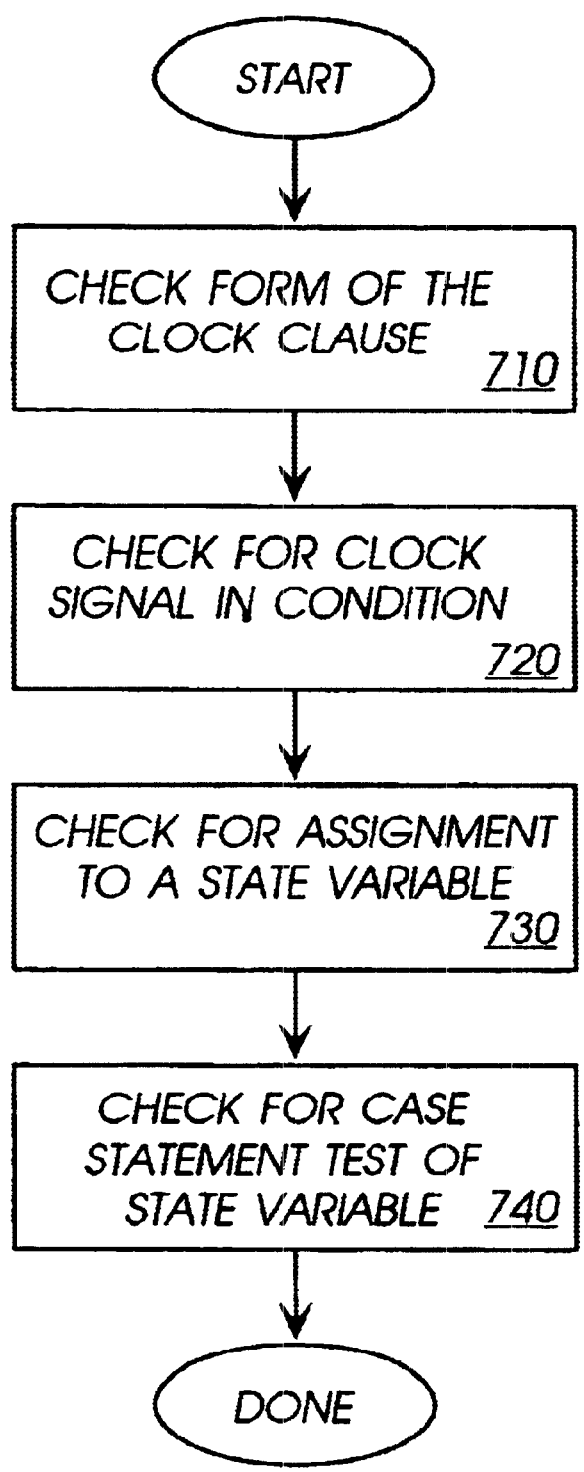
FIG. 7 is one embodiment of a flow diagram for identifying a clock clause according to the present invention.

FIG. 7 is one embodiment of a flow diagram for identifying a clock clause of a state machine from corresponding high-level IC description language code. The form of the clock condition is checked, 710. In one embodiment, the form must be <IF or ELSIF> <clock_condition> THEN <action>. The condition is checked for the CLOCK signal, 720. In one embodiment, the clock condition can be a function call with one parameter (e.g., rising_edge(clk)) or an event test and level test (e.g., clk' event NAD clk='1'.

The action in the THEN part of the clock clause is checked for an assignment to a state variable, 730 or for a "case" statement test of the state variable, 740. If the clock clause is within a combined clocked and transition process, the THEN part of the clock clause typically contains a case statement testing the current state variable. if the clock clause is within a clocked process that is not a transition process, the THEN part of the clock clause typically contains an assignment to the current state variable. The present invention tests for both eventualities in order to identify the current state variable in either case. If 710, 720 and 730 or 740 are performed successfully, the CLOCK clause has been recognized. Otherwise, recognition ceases when a check is not satisfied.

Figure 8:
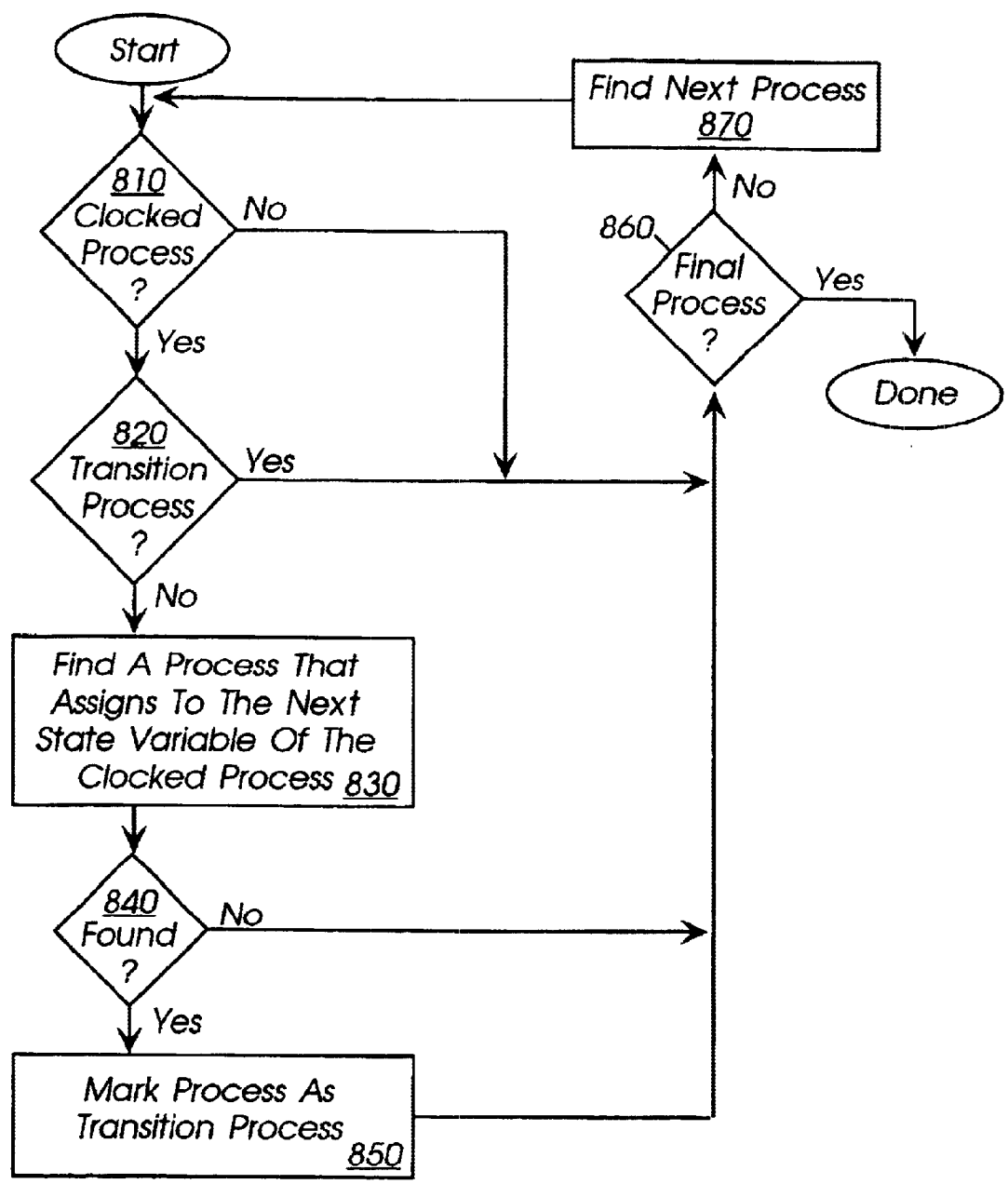
FIG. 8 is one embodiment of a flow diagram for identifying a process providing a next state assignment according to the present invention.

FIG. 8 is one embodiment of a flow diagram for identifying a process that provides a next state assignment according to the present invention. The description with respect to FIG. 8 identifies a transition process that is a clocked process. A process that is both a transition process and a clocked process can also be marked as a transition process as described above with respect to FIG. 5.

The process is checked to determine whether the process is a clocked process, 810. If the process is not a clocked process at 810 and the process is not the final process at 860, the next process to be evaluated is found, 870. If the process is a clocked process at 810, the process is checked to determine whether the process is a transition process, 820. If the process has been previously marked as a transition process at 820 and the process is not the final process at 860, the next process to evaluate is found, 870.

If the process is not a transition process at 820, a process that assigns to the next state variable of the clocked process is found, 830. If a process that assigns to the next state variable is found at 840, the process is marked as a transition process 850.

If a process is that assigns to the next state variable is not found at 840 and the process is not the final process at 860, the next process is found, 870. If a process is marked as a transition process at 850 and the process is not the final process at 860, the next process is found. Otherwise, processing is complete.

Figure 9:
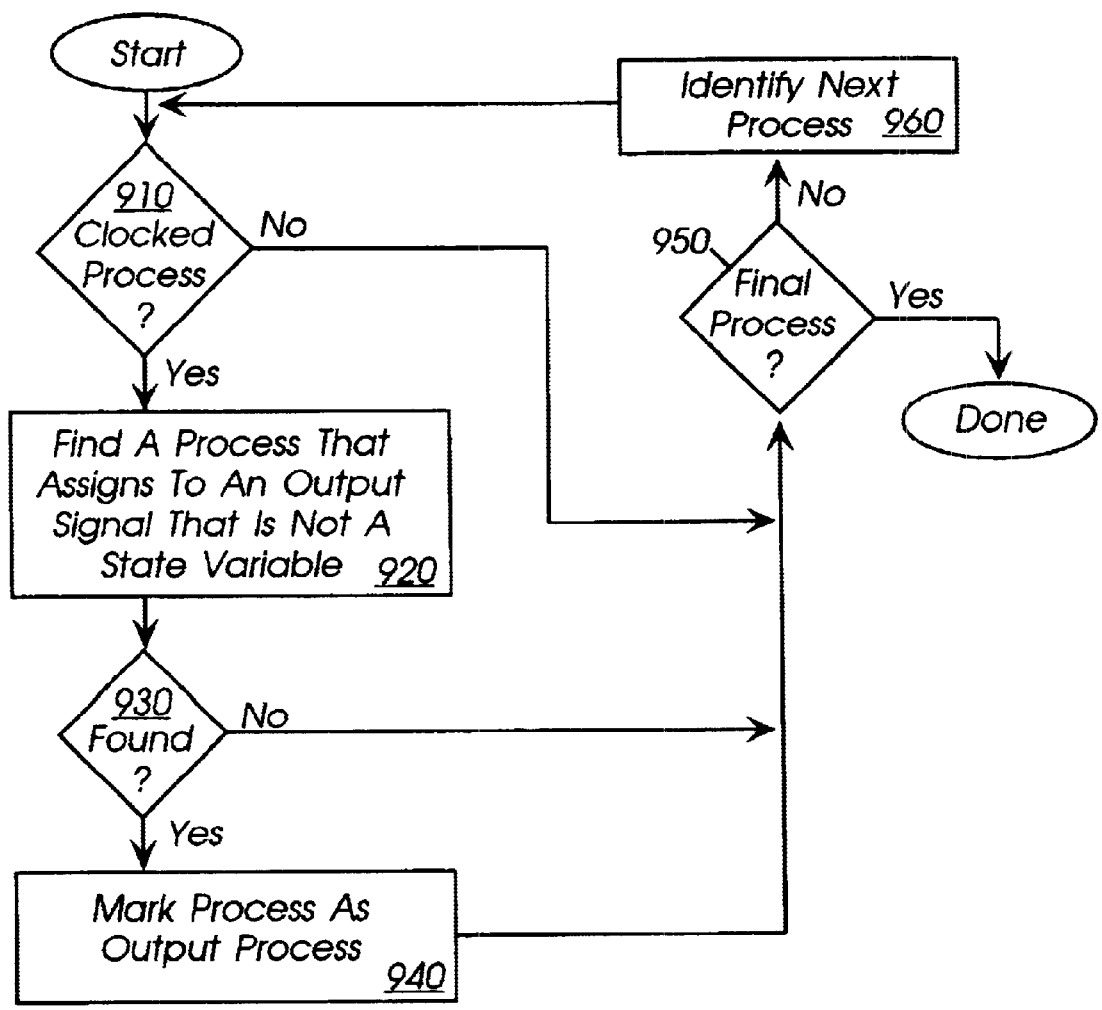
FIG. 9 is one embodiment of a flow diagram for identifying an output process according to the present invention.

FIG. 9 is one embodiment of a flow diagram for identifying an output process according to the present invention. The flow of FIG. 9 determines whether an output signal is assigned a value. Processes that determine output signals are marked as output processes.

The process is checked to determine whether the process is a clocked process at 910. If the process is not a clocked process at 910 and the process is not the final process at 950, the next process is identified at 960. If the process is the final process at 950, the evaluation described with respect to FIG. 9 is complete.

If the process is a clocked process at 910, a process that assigns to an output signal that is not a state variable is found at 920. The process identified at 920 is an output process. If an output process is not found at 930 and the process is not the final process at 950, the next process to be evaluated is identified at 960. If the process is the final process at 950, the evaluation described with respect to FIG. 9 is complete.

If an output process is found at 930, the process is marked as an output process at 940. If an output process is not found at 930 and the process is not the final process at 950, the next process to be evaluated is identified at 960. If the process is the final process at 950, the evaluation described with respect to FIG. 9 is complete.

Figure 10:
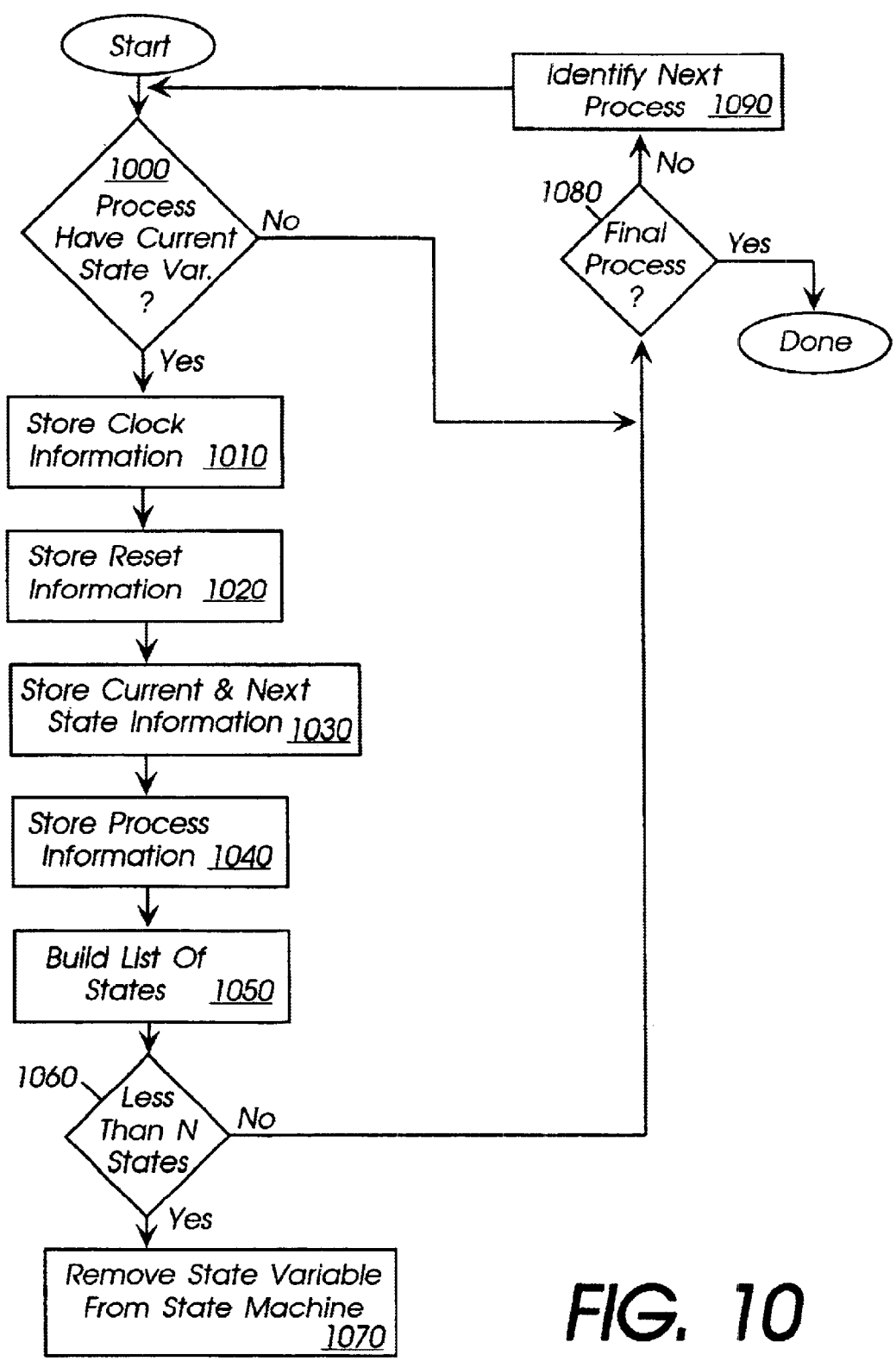
FIG. 10 is one embodiment of a flow diagram for building a state machine summary according to the present invention.

FIG. 10 is one embodiment of a flow diagram for building a state machine summary according to the present invention. In one embodiment, the state machine summary is used to provide information describing the behavioral characteristics of the state machine.

The process is checked to determine whether the process has a current state variable at 1000. If the process does not have a current state variable at 1000 and the process is not the final process to be evaluated at 1080, the next process to be evaluated is identified at 1090. If the process is the final process at 1080, the evaluation described with respect to FIG. 10 is complete.

If the process has a current state variable at 1000, clock information is stored at 1010. In one embodiment, clock information includes a clock signal name and a clock signal type. Reset information is stored at 1020. In one embodiment, reset information includes a reset signal name and a reset signal type.

Current and next state information is stored at 1030. In one embodiment, current and next state information includes a current state variable name, a next state variable name and a state variable type. In one embodiment, the next state variable and the current state variable should be of the same type. Process information is stored at 1040. Storage of process information is described in greater detail below with respect to FIG. 11.

A list of states is built at 1050. The number of the states in the list of states is compared to the number of states corresponding to the minimum number of states ("N") required for the high-level description language code to be considered a state machine. In one embodiment, N=1; however, such an embodiment may result in an unacceptable number of false positives, which can be the result of coding style. A false positive occurs when code that does not implement a state machine is recognized as a state machine. In an alternative embodiment, N=2, which provides more reliable recognition than when N=1.

Figure 11:
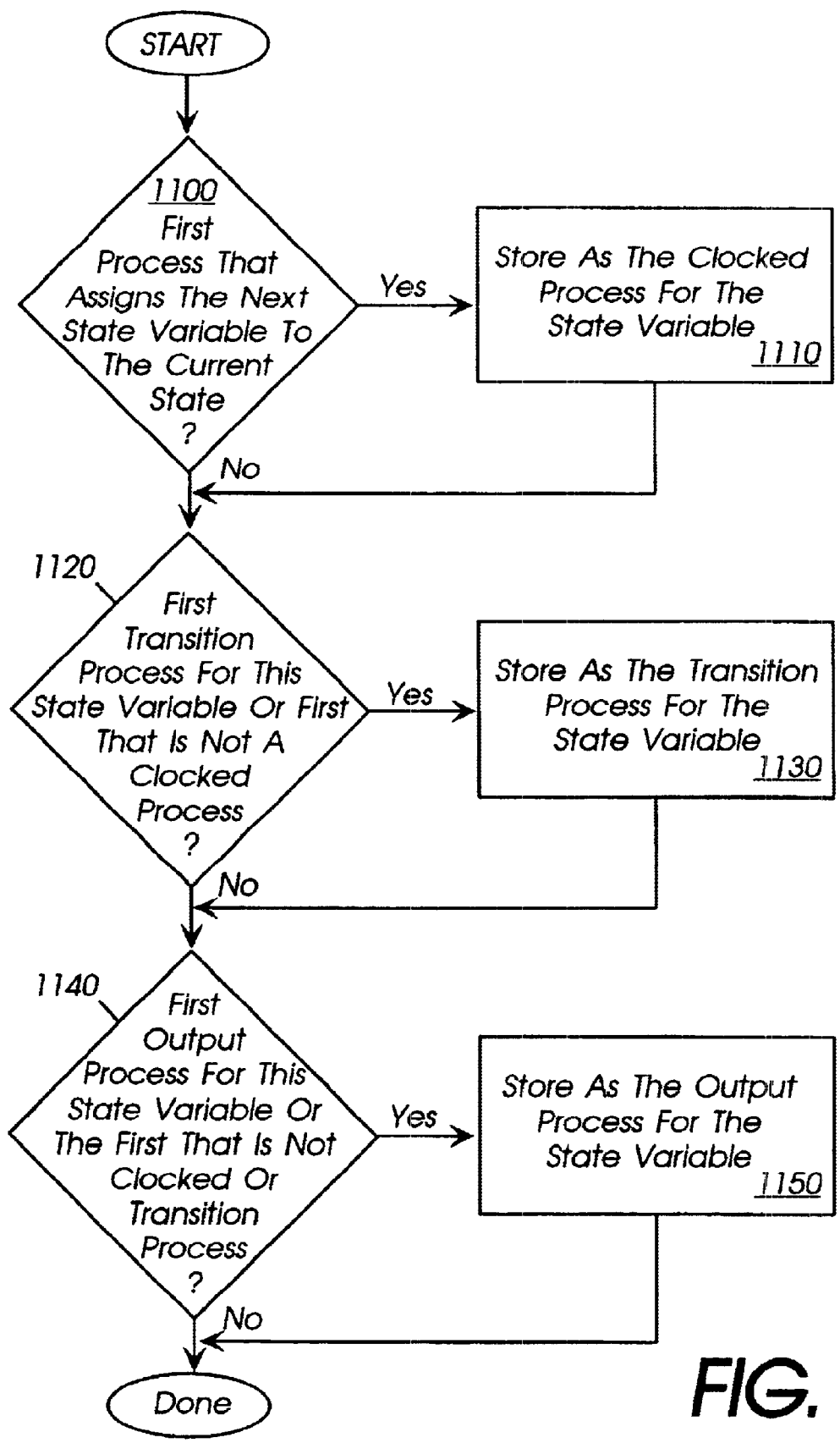
FIG. 11 is one embodiment of a flow diagram for storing process information according to the present invention.

FIG. 11 is one embodiment of a flow diagram for storing process information according to the present invention. The information stored as described with respect to FIG. 11 provides information for building a state machine model. Additional or different information can also be stored in order to provide a different or augmented state machine model. In one embodiment, the evaluation described with respect to FIG. 11 is performed for each process.

If the process is the first process that assigns the next state variable to the current state variable at 1100, the process is stored as the clocked process for the state variable at 1110. The clocked process for a state variable is the process that evaluates conditions that affect the state of the state machine on clock transitions.

If the process is the first transition process for a particular state variable or the first transition process that is not a clocked process at 1120, the process is stored as the transition process for the state variable at 1130. The transition process for a particular state variable is the transition process that assigns values to the state variable.

If the process is the first output process for a state variable or the first output process that is not a clocked or transition process at 1140, the process is stored as the output process for the state variable at 1150. The output process for the state variable is the process that assigns values to output signals associated with the state variable.

FIG. 12 is one embodiment of an output generated describing the state machine of FIGS. 3a–3n according to the present invention. The output of FIG. 12 describes clock name and type, reset name and type, state variable information for two state variables because the state machine of FIGS. 3a–3n is a concurrent state machine. Other output information can also be provided.

In the foregoing specification, the present invention has been described with reference to specific embodiments thereof. It will, however, be evident that various modifications and changes can be made thereto without departing from the broader spirit and scope of the invention. The specification and drawings are, accordingly, to be regarded in an illustrative rather than a restrictive sense.

What is claimed is:

1. A method for identifying an integrated circuit (IC) implementation of a state machine in a high-level IC description language code comprising:

identifying one or more transition processes within the high-level IC description language code;

identifying one or more clocked processes within the high-level IC description language code;

identifying one or more output processes within the high-level IC description language code; and building a state machine summary based at least in part on the one or more identified transition processes, wherein building the state machine summary is based at least in part on the one or more identified transition processes, the one or more identified clocked processes and the one or more identified output processes.

2. The method of claim 1 wherein identifying one or more clocked processes further comprises:

determining whether the one or more clocked processes includes a sensitivity list;

identifying a first IF statement in the one or more clocked processes for each clocked process that includes a sensitivity list;

identifying conditions associated with the IF statement, if any; and determining a clock clause from the IF statement and associated conditions.

3. The method of claim 2 wherein the determining the clock clause further comprises:

checking a form of the clock clause;

checking for an assignment to a state variable by the clock clause; and checking for a case statement test of the state variable.

4. The method of claim 2 further comprising determining a reset clause from the IF statement as associated conditions.

5. The method of claim 2 farther comprising:

identifying a current state variable for the process; and identifying a next state variable for the process.

6. The method of claim 1 wherein determining the one or more transition processes comprises identifying a process that assigns a value to a next state variable.

7. The method of claim 1 wherein building a state machine summary comprises generating a graphical representation of the state machine.

8. The method of claim 1 wherein building a state machine summary comprises generating a textual description of the state machine.

9. A machine-readable medium having stored thereon sequences of instructions, which when executed by a processor cause the processor to:

identify one or more transition processes within a high-level IC description language code;

identify one or more clocked processes within the high-level IC description language code;

identify one or more output processes within the high-level IC description language code; and build a state machine summary based at least in part on the one or more identified transition processes, wherein building the state machine summary is based at least in part on the one or more identified transition processes, the one or more identified clocked processes and the one or more identified output processes.

10. The machine-readable medium of claim 9 wherein the sequences of instructions that cause the processor to identify one or more clocked processes further comprise sequences of instructions that cause the processor to:

determine whether the one or more clocked processes includes a sensitivity list;

identify a first IF statement in the one or more clocked processes for each clocked process that includes a sensitivity list;

identify conditions associated with the IF statement, if any; and determine a clock clause from the IF statement and associated conditions.

11. The machine-readable medium of claim 10 wherein the sequences of instructions to cause the processor to determine the clock clause further comprise sequences of instructions, which when executed cause the processor to:

check a form of the clock clause;

check for an assignment to a state variable by the clock clause; and check for a case statement test of the state variable.

12. The machine-readable medium of claim 10 further comprising sequences of instructions, which when executed cause the processor to determine a reset clause from the IF statement as associated conditions.

13. The machine-readable medium of claim 10 further comprising sequences of instructions, which when executed cause the processor to:

identify a current state variable for the process; and identify a next state variable for the process.

14. The machine-readable medium of claim 9 wherein the sequences of instructions that cause the processor to determine the one or more transition processes further comprise sequences of instructions that cause the processor to identify a process that assigns a value to a next state variable.

15. The machine-readable medium of claim 9 wherein the sequences of instructions that cause the processor to build a state machine summary comprise sequences of instructions that cause the processor to generate a graphical representation of the state machine.

16. The machine-readable medium of claim 9 wherein the sequences of instructions that cause the processor to build a state machine summary comprise sequences of instructions that cause the processor to generate a textual description of the state machine.

17. An apparatus that identifies an integrated circuit (IC) implementation of a state machine in a high-level IC description language code comprising:

identifying one or more transition processes within the high-level IC description language code;

means for identifying one or more clocked processes within the high-level IC description language code;

means for identifying one or more output processes within the high-level IC description language code; and means for building a state machine summary based at least in part on the one or more identified transition processes, wherein building the state machine summary is based at least in part on the one or more identified transition processes, the one or more identified clocked processes and the one or more identified output processes.

18. The apparatus of claim 17 wherein the means for identifying one or more clocked processes further comprises:

means for determining whether the one or more clocked processes includes a sensitivity list;

means for identifying a first IF statement in the one or more clocked processes for each clocked process that includes a sensitivity list;

means for identifying conditions associated with the IF statement, if any; and means for determining a clock clause from the IF statement and associated conditions.

19. The apparatus of claim 18 wherein the means for determining the clock clause further comprises:

means for checking a form of the clock clause;

means for checking for an assignment to a state variable by the clock clause; and means for checking for a case statement test of the state variable.

20. The apparatus of claim 18 further comprising means for determining a reset clause from the IF statement as associated conditions.

21. The apparatus of claim 18 further comprising:

means for identifying a current state variable for the process; and means for identifying a next state variable for the process.

22. The apparatus of claim 17 wherein the means for determining the one or more transition process comprises means for identifying a process that assigns a value to a next state variable.

* * * * *

UNITED STATES PATENT AND TRADEMARK OFFICE
CERTIFICATE OF CORRECTION

PATENT NO. : 6,675,359 B2
DATED : January 6, 2004
INVENTOR(S) : Gilford et al.

It is certified that error appears in the above-identified patent and that said Letters Patent is hereby corrected as shown below:

Column 1,
Line 17, "Verilog® (M are commonly" should be -- Verilog® are commonly --

Column 5,
Line 50, "$1_{13}$nextstate" should be -- 1_nextstate --

Signed and Sealed this

Twenty-first Day of June, 2005

JON W. DUDAS
*Director of the United States Patent and Trademark Office*